US010141531B2

(12) United States Patent
Forrest et al.

(10) Patent No.: US 10,141,531 B2
(45) Date of Patent: Nov. 27, 2018

(54) HYBRID PLANAR-GRADED HETEROJUNCTION FOR ORGANIC PHOTOVOLTAICS

(71) Applicant: THE REGENTS OF THE UNIVERSITY OF MICHIGAN, Ann Arbor, MI (US)

(72) Inventors: Stephen R. Forrest, Ann Arbor, MI (US); Jeramy D. Zimmerman, Golden, CO (US); Brian E. Lassiter, San Francisco, CA (US); Xin Xiao, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/647,601

(22) PCT Filed: Nov. 27, 2013

(86) PCT No.: PCT/US2013/072309
§ 371 (c)(1),
(2) Date: May 27, 2015

(87) PCT Pub. No.: WO2014/085639
PCT Pub. Date: Jun. 5, 2014

(65) Prior Publication Data
US 2015/0340634 A1    Nov. 26, 2015

Related U.S. Application Data

(60) Provisional application No. 61/730,687, filed on Nov. 28, 2012.

(51) Int. Cl.
*H01L 31/00* (2006.01)
*H01L 51/42* (2006.01)
(Continued)

(52) U.S. Cl.
CPC .......... *H01L 51/4253* (2013.01); *B82Y 10/00* (2013.01); *H01L 51/0046* (2013.01); *H01L 51/0078* (2013.01); *Y02E 10/549* (2013.01)

(58) Field of Classification Search
CPC ............ H01L 51/4253; H01L 51/0078; H01L 51/0046; B82Y 10/00; Y02E 10/549
See application file for complete search history.

(56) References Cited

FOREIGN PATENT DOCUMENTS

WO    WO 2012/098876    7/2012

OTHER PUBLICATIONS

Schultes et al., "The role of molecular architecture and layer composition on the properties and performance of CuPc—C60 photovoltaic devices," Materials Science and Engineering C 25 (2005) 858-865.*

(Continued)

*Primary Examiner* — Angelo Trivisonno
(74) *Attorney, Agent, or Firm* — Finnegan, Henderson, Farabow, Garrett & Dunner, LLP

(57) ABSTRACT

Disclosed herein are organic photosensitive optoelectronic devices comprising at least one hybrid planar-graded heterojunction. In particular, organic photosensitive optoelectronic devices are disclosed having two electrodes (110), (150) in superposed relation, a graded heterojunction layer (130) located between the two electrodes, and at least one photoactive layer (120), (140) adjacent to and interfacing with the graded heterojunction layer.

22 Claims, 6 Drawing Sheets

(51) Int. Cl.
  *B82Y 10/00*    (2011.01)
  *H01L 51/00*    (2006.01)

(56) References Cited

OTHER PUBLICATIONS

Qin et al., "Measuring the exciton diffusion length of C60 in organic planar heterojunction solar cells," Phys. Status Solidi A 208, No. 8, 1967-1971 (2011) / DOI 10.1002/pssa.201026724.*

International Search Report and Written Opinion of the International Searching Authority issued in International Application No. PCT/US2013/072309, dated Feb. 28, 2014, 12 pages.

Stübinger, Thomas et al., "Exciton Diffusion and Optical Interference in Organic Donor-Acceptor Photovoltaic Cells," *Journal of Applied Physics*, vol. 90, No. 7, Oct. 1, 2001, © 2001 American Institute of Physics, pp. 3632-3641.

Tress, Wolfgang et al., "Effect of Concentration Gradients in ZnPc:$C_{60}$ Bulk Heterojunction," *Solar Energy Materials & Solar Cells 95* (2011) 2981-2986, © Elsevier B.V., 6 pages.

Kozub et al., "Direct measurements of exciton diffusion length limitations on organic solar cell performance," Chemical Communications—Chemcom., vol. 48, No. 47, p. 5859 (Jan. 1, 2012), XP055351212, ISSN: 1359-7345, DOI: 10.1039/c2cc31925j.

Zheng et al., "Organic Photovoltaic Cells Based on Molecular Donor-Acceptor Heterojunctions," Polymer Reviews, vol. 50, No. 4, pp. 420-453 (2010).

* cited by examiner

HYBRID PLANAR-GRADED HETEROJUNCTION FOR ORGANIC PHOTOVOLTAICS

CROSS-REFERENCE TO RELATED APPLICATION

This application claims the benefit of U.S. Provisional Application No. 61/730,687, filed Nov. 28, 2012, which is incorporated herein by reference in its entirety.

STATEMENT REGARDING FEDERALLY SPONSORED RESEARCH

This invention was made with U.S. Government support under Contract Nos. DE-SC0000957 and DE-EE0005310 awarded by the U.S. Department of Energy, and under FA9550-10-1-0339 awarded by the Air Force Office of Scientific Research. The government has certain rights in the invention.

JOINT RESEARCH AGREEMENT

The subject matter of the present disclosure was made by, on behalf of, and/or in connection with one or more of the following parties to a joint university-corporation research agreement: The Regents of the University of Michigan and Global Photonic Energy Corporation. The agreement was in effect on and before the date the subject matter of the present disclosure was prepared, and was made as a result of activities undertaken within the scope of the agreement.

The present disclosure generally relates to organic photosensitive optoelectronic devices and, in particular, to organic photosensitive optoelectronic devices comprising at least one hybrid planar-graded heterojunction.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the photovoltaic (PV) device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, FF.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, FF, defined as:

$$FF = \{I_{max}V_{max}\}/\{I_{SC}V_{OC}\} \quad (1)$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = FF*(I_{SC}*V_{OC})P_{inc}$$

To produce internally generated electric fields that occupy a substantial volume of the semiconductor, the usual method is to juxtapose two layers of material (donor and acceptor) with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies, also known as the HOMO-LUMO gap. The Fermi energy characterizes the statistical occupation of molecular quantum energy states denoted by the value of energy for which the probability of occupation is equal to ½. A Fermi energy near the conduction band minimum (LUMO) energy indicates that electrons are the predominant carrier. A Fermi energy near the valence band maximum (HOMO) energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. In some cases, an acceptor material may be an ETL and a donor material may be an HTL.

Conventional inorganic semiconductor PV cells may employ a p-n junction to establish an internal field. However, it is now recognized that in addition to the establishment of a p-n type junction, the energy level offset of the heterojunction also plays an important role.

The energy level offset at an organic donor-acceptor (D-A) heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Carrier generation requires exciton generation, diffusion, and ionization or collection. There is an efficiency η associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D$~50 Å) than the optical absorption length (~500 Å), requiring a tradeoff between using a thick, and therefore resistive, cell with multiple or highly folded interfaces, or a thin cell with a low optical absorption efficiency.

Uniform mixtures of donor and acceptor materials may be used to form mixed heterojunction (HJ) organic PV cells. These cells benefit from a high exciton diffusion efficiency, $\eta_{ED}$, but suffer from a low charge collection efficiency, $\eta_{CC}$. To improve $\eta_{CC}$, the concentrations of donor and acceptor materials may vary across the mixed photoactive layer forming a graded heterojunction to provide paths for charge carrier extraction. Disclosed herein are graded heterojunction organic photosensitive devices with improved performance. The novel devices of the present disclosure comprise at least one hybrid planar-graded heterojunction. In particular, organic photosensitive optoelectronic devices are disclosed having two electrodes in superposed relation, a graded heterojunction layer located between the two electrodes, and at least one photoactive layer adjacent to and interfacing with the graded heterojunction layer.

Also disclosed herein is an organic photosensitive optoelectronic device comprising two electrodes in superposed relation; a mixed photoactive layer located between the two electrodes, wherein the mixed photoactive layer has first and second boundary interfaces and comprises at least one donor material having a highest occupied molecular orbital (HOMO) energy and at least one acceptor material having a lowest unoccupied molecular orbital energy (LUMO), wherein a concentration of the at least one acceptor material in the mixed layer is maximum at the first boundary interface and decreases in the direction of the second boundary interface, and wherein a concentration of the at least one donor material in the mixed layer is maximum at the second boundary interface and decreases in the direction of the first boundary interface; and a first photoactive layer adjacent to the mixed photoactive layer and interfacing with the first boundary interface, wherein the first photoactive layer comprises a material having a LUMO energy within 0.3 eV of the LUMO energy of the at least one acceptor material.

In some embodiments, the device further comprises a second photoactive layer adjacent to the mixed photoactive layer and interfacing with the second boundary interface, wherein the second photoactive layer comprises a material having a HOMO energy within 0.3 eV of the HOMO energy of the at least one donor material.

In another embodiment of the present disclosure, an organic photosensitive optoelectronic device comprises two electrodes in superposed relation; a mixed photoactive layer located between the two electrodes, wherein the mixed photoactive layer has first and second boundary interfaces and comprises at least one donor material having a highest occupied molecular orbital (HOMO) energy and at least one acceptor material having a lowest unoccupied molecular orbital energy (LUMO), wherein a concentration of the at least one acceptor material in the mixed layer is maximum at the first boundary interface and decreases in the direction of the second boundary interface, and wherein a concentration of the at least one donor material in the mixed layer is maximum at the second boundary interface and decreases in the direction of the first boundary interface; and a photoactive layer adjacent to the mixed photoactive layer and interfacing with the second boundary interface, wherein the photoactive layer comprises a material having a HOMO energy within 0.3 eV of the HOMO energy of the at least one donor material.

The accompanying figures are incorporated in, and constitute a part of this specification.

FIGS. 6A, 6B, 6C, and 6D show device structures of certain graded heterojunction and hybrid planar-graded heterojunction cells used to generate organic photovoltaic performance data.

Figure 7:
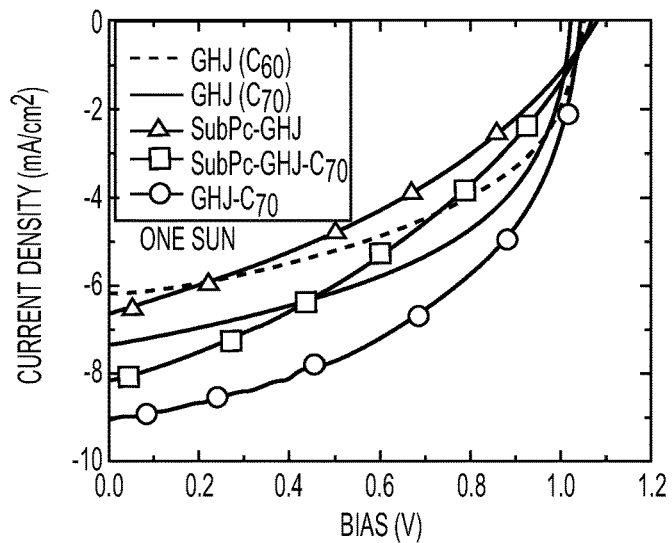

FIG. 7 compares current-voltage (J-V) characteristics of certain graded heterojunction and hybrid planar-graded heterojunction cells under one sun illumination.

Figure 8:
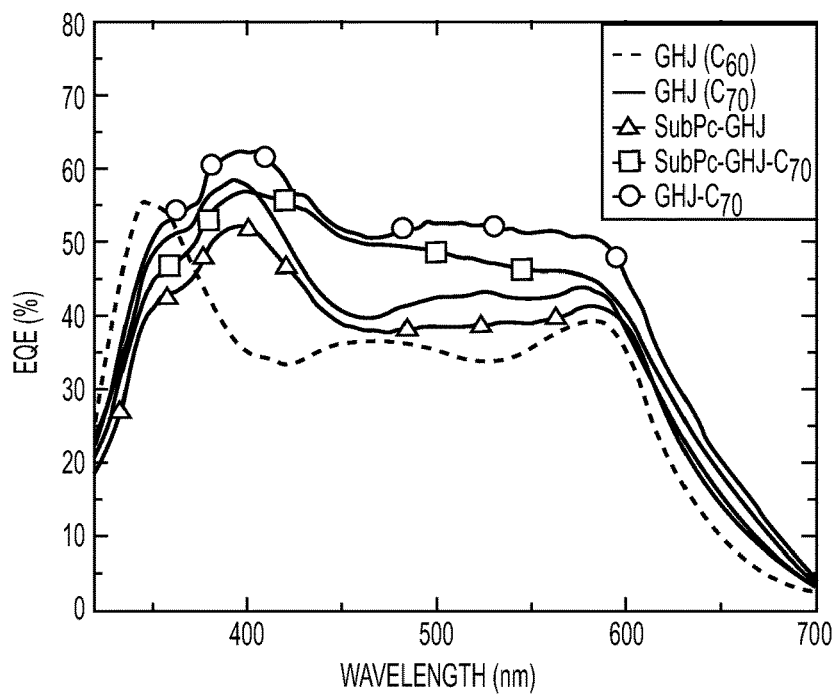

FIG. 8 compares EQE spectra of certain graded heterojunction and hybrid planar-graded heterojunction cells.

Figure 9:
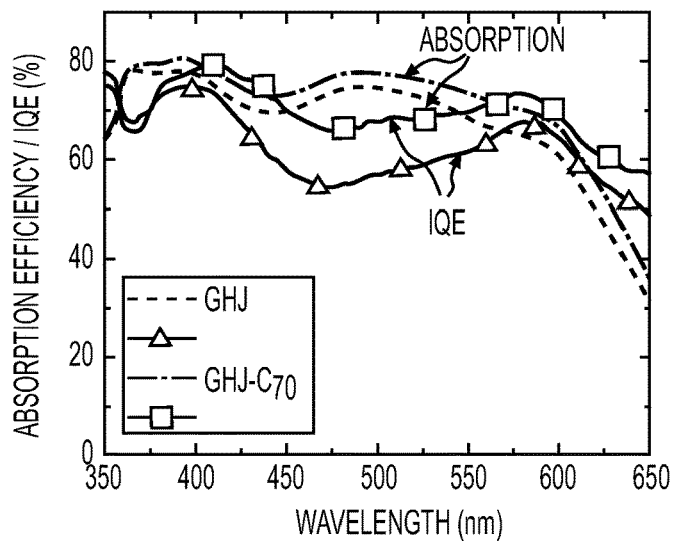

FIG. 9 compares calculated absorption efficiency and internal quantum efficiency (IQE) of certain graded heterojunction and hybrid planar-graded heterojunction cells.

Figure 10:
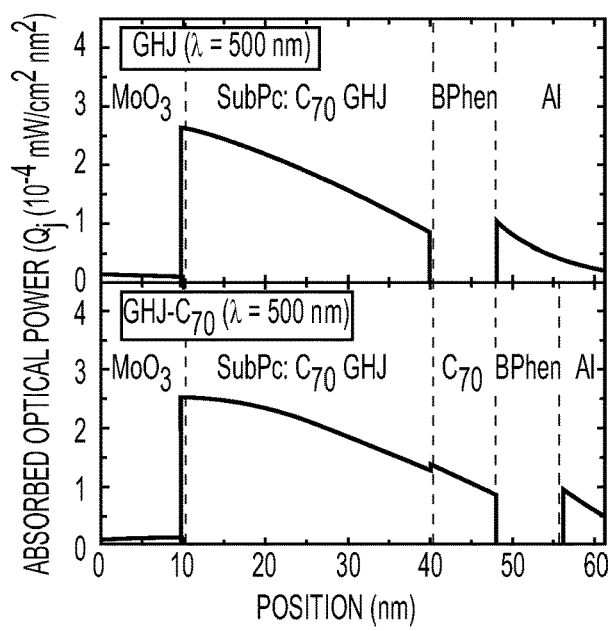

FIG. 10 compares the spatial distribution of absorbed optical power inside of a graded heterojunction cell and a hybrid planar-graded heterojunction cell.

Figure 11:
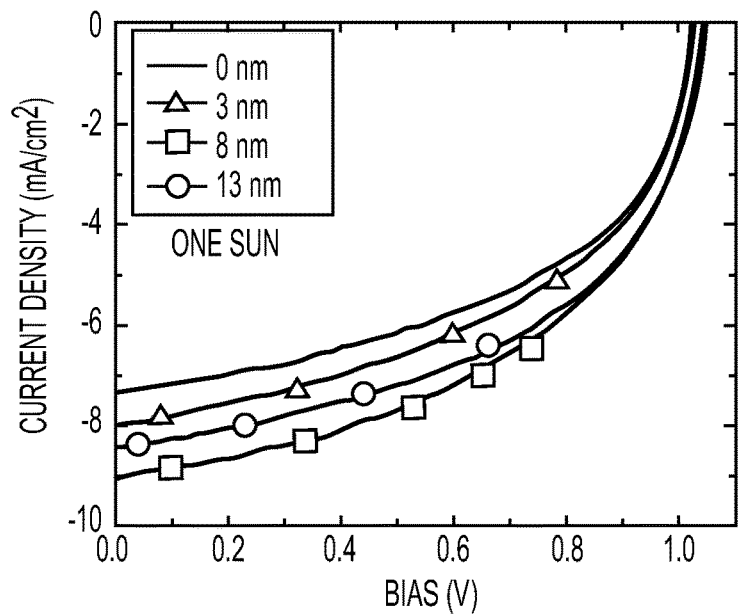

FIG. 11 shows J-V characteristics of planar-graded heterojunction cells at various thicknesses of a neat $C_{70}$ layer under one sun illumination.

Figure 12:
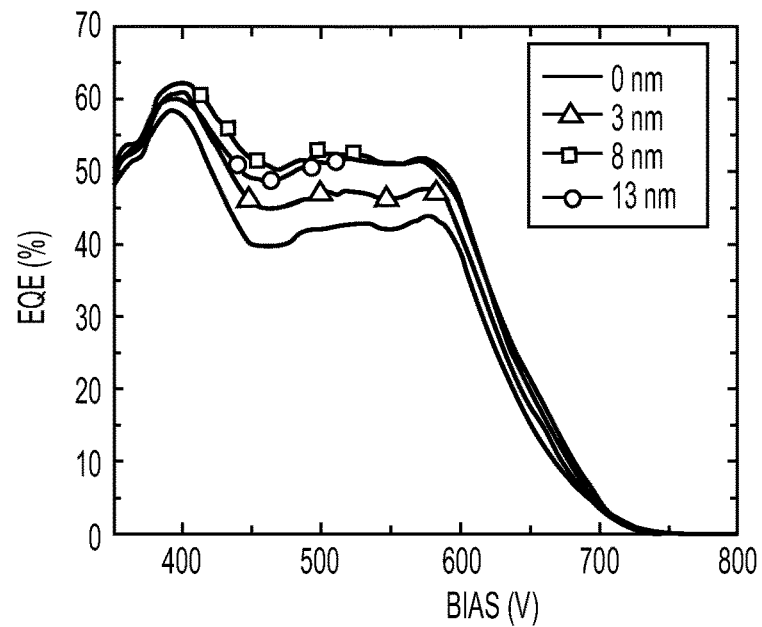

FIG. 12 shows EQE spectra of hybrid planar-graded heterojunction cells at various thicknesses of a neat $C_{70}$ layer.

As used herein, the term "organic" includes polymeric materials as well as small molecule organic materials that may be used to fabricate organic photosensitive devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone.

The terms "electrode" and "contact" are used herein to refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Anodes and cathodes are examples. U.S. Pat. No. 6,352,777, incorporated herein by reference for its disclosure of electrodes, provides examples of electrodes, or contacts, which may be used in a photosensitive optoelectronic device. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent. An electrode is said to be "transparent" when it permits at least 50% of the ambient electromagnetic radiation in relevant wavelengths to be transmitted through it. An electrode is said to be "semi-transparent" when it permits some, but less that 50% transmission of ambient electromagnetic radiation in relevant wavelengths. The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, a "photoactive region" refers to a region of the device that absorbs electromagnetic radiation to generate excitons. Similarly, a layer is "photoactive" if it absorbs electromagnetic radiation to generate excitons. The excitons may dissociate into an electron and a hole in order to generate an electrical current.

Figure 4:
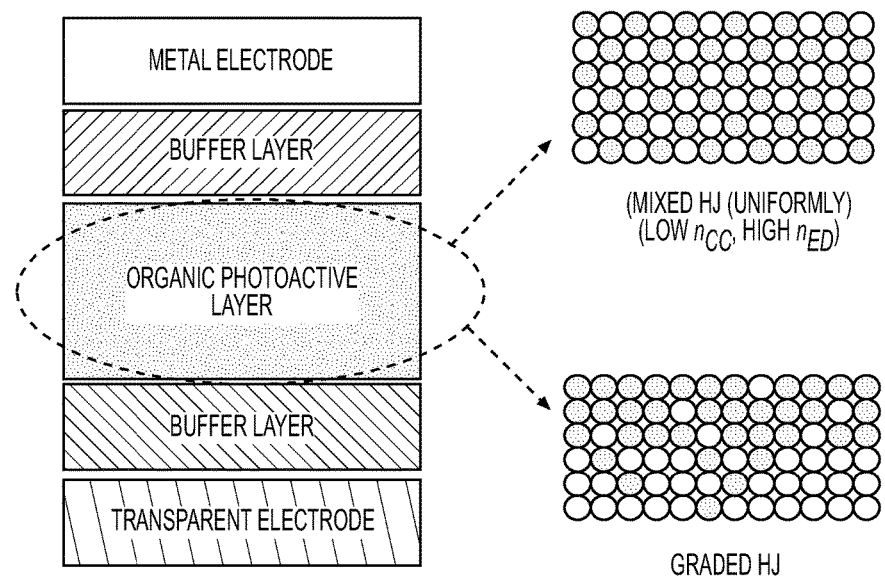
FIG. 4 depicts a device schematic of a generic organic photosensitive optoelectronic device and contrasts a uniformly mixed heterojunction with an example of the concentration gradient of a graded heterojunction.

As used herein, a "graded heterojunction layer" is a layer comprising at least one donor material and at least one acceptor material and having first and second boundary interfaces, wherein a concentration of the at least one acceptor material in the layer is at a maximum at the first boundary interface and decreases in the direction of the second boundary interface, and wherein a concentration of the at least one donor material in the layer is at a maximum at the second boundary interface and decreases in the direction of the first boundary interface. FIG. 4 depicts a device schematic of a generic organic photosensitive optoelectronic device and contrasts a uniformly mixed heterojunction with an example of the concentration gradient of a graded heterojunction.

In the context of the organic materials of the present disclosure, the terms "donor" and "acceptor" refer to the relative positions of the HOMO and LUMO energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

The devices of the present disclosure comprise at least one mixed photoactive layer that is a graded heterojunction. As shown in the non-limiting device schematic in FIG. 1, an organic photosensitive optoelectronic device 100 of the present disclosure may comprise two electrodes 110 and 150 in superposed relation, a mixed photoactive layer 130 located between the two electrodes, wherein the mixed photoactive layer has a first boundary interface 160 and a second boundary interface 170 and comprises at least one donor material having a highest occupied molecular orbital (HOMO) energy and at least one acceptor material having a lowest unoccupied molecular orbital energy (LUMO), wherein a concentration of the at least one acceptor material in the mixed layer is maximum at the first boundary interface 160 and decreases in the direction of the second boundary interface 170, and wherein a concentration of the at least one donor material in the mixed layer is maximum at the second boundary interface 170 and decreases in the direction of the first boundary interface 160; and a first photoactive layer 140 adjacent to the mixed photoactive layer and interfacing with the first boundary interface, wherein the first photoactive layer comprises a material having a LUMO energy within 0.3 eV of the LUMO energy of the at least one acceptor material.

Figure 1:
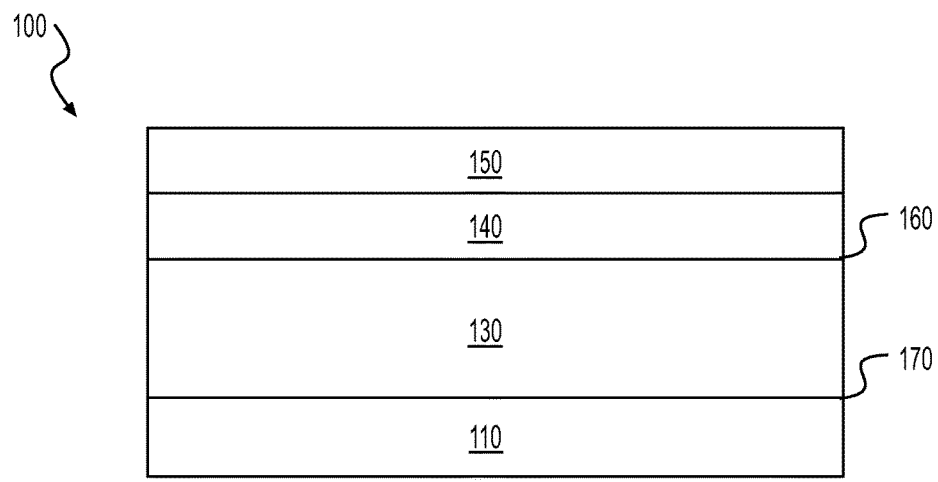
FIG. 1 shows a schematic of an exemplary device comprising a hybrid planar-graded heterojunction according to the present disclosure.

As shown in FIG. 1, in some embodiments, the mixed photoactive layer 130 is adjacent to and interfaces with electrode 110. In other embodiments, the device may further comprise at least one buffer layer between electrode 110 and mixed layer 130. The at least one buffer layer may be positioned adjacent to and may interface with the mixed layer 130. The buffer layer may be selected so as not to inhibit the transport of holes to electrode 110. In some embodiments, the buffer layer is a hole-transport material. In some embodiments, the buffer layer is an exciton-blocking hole transport material. The buffer layer may comprise materials known in the art, such as organic materials. In some embodiments, the buffer layer is a metal oxide. In some embodiments, the buffer layer is a conductive polymer. Examples of buffer materials include but are not limited to $MoO_3$, $V_2O_5$, $WO_3$, $CrO_3$, $Co_3O_4$, NiO, ZnO, $TiO_2$, polyaniline (PANI), poly(3,4-ethylenedioxythiophene), and poly (styrenesulfonate) (PEDOT-PSS). In some embodiments, the buffer layer is a self-assembled monolayer.

One of the electrodes of the present disclosure may be an anode, and the other electrode a cathode. For example, in FIG. 1, electrode 110 may be an anode, and electrode 150 may be a cathode. It should be understood that the electrodes should be optimized to receive and transport the desired carrier (holes or electrons). The term "cathode" is used herein such that in a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photoconducting material, which is equivalent to electrons moving in the opposite manner.

The mixed photoactive layer 130 of the present disclosure is a graded heterojunction layer as defined herein. It comprises at least one donor material having a HOMO energy and at least one acceptor material having a LUMO energy. Examples of suitable donor materials include but are not limited to phthalocyanines, such as copper phthalocyanine (CuPc), chloroaluminium phthalocyanine (ClAlPc), tin phthalocyanine (SnPc), zinc phthalocyanine (ZnPc), and other modified phthalocyanines, subphthalocyanines, such as boron subphthalocyanine (SubPc), naphthalocyanines, merocyanine dyes, boron-dipyrromethene (BODIPY) dyes, thiophenes, such as poly(3-hexylthiophene) (P3HT), low band-gap polymers, polyacenes, such as pentacene and tetracene, diindenoperylene (DIP), squaraine (SQ) dyes, and tetraphenyldibenzoperiflanthene (DBP). Other organic donor materials are contemplated by the present disclosure.

Examples of squaraine donor materials include but are not limited to 2,4-bis[4-(N,N-dipropylamino)-2,6-dihydroxyphenyl]squaraine, 2,4-bis[4-(N,Ndiisobutylamino)-2,6-dihydroxyphenyl]squaraine, 2,4-bis[4-(N,N-diphenylamino)-2,6-dihydroxyphenyl]squaraine (DPSQ) and salts thereof. Additional examples of suitable squaraine materials are disclosed in U.S. Patent Publication No. 2012/0248419, which is incorporated herein by reference for its disclosure of squaraine materials.

Examples of suitable acceptor materials for the present disclosure include but are not limited to polymeric or non-polymeric perylenes, polymeric or non-polymeric naphthalenes, and polymeric or non-polymeric fullerenes and fullerene derivatives (e.g., PCBMs, ICBA, ICMA, etc.). Non-limiting mention is made to those chosen from $C_{60}$, $C_{70}$, $C_{76}$, $C_{82}$, $C_{84}$, or derivatives thereof such as Phenyl-$C_{61}$-Butyric-Acid-Methyl Ester ([60]PCBM), Phenyl-$C_{71}$-Butyric-Acid-Methyl Ester ([70]PCBM), or Thienyl-$C_{61}$-Butyric-Acid-Methyl Ester ([60]ThCBM), and other acceptors such as 3,4,9,10-perylenetetracarboxylic-bisbenzimidazole (PTCBI), hexadecafluorophthalocyanine ($F_{16}$CuPc), and derivatives thereof. Other organic acceptor materials are contemplated by the present disclosure.

In some embodiments, the at least one donor material is present in the mixed photoactive layer 130 in an amount less than the at least one acceptor material. In certain embodiments, the mixed photoactive layer 130 comprises the at least one donor material and the at least one acceptor material at a donor:acceptor ratio ranging from 1:1 to 1:50, such as, for example, from 1:2 to 1:50, from 1:2 to 1:35, from 1:2 to 1:25, from 1:4 to 1:20, from 1:4 to 1:16, from 1:4 to 1:12, from 1:4 to 1:10, or from 1:4 to 1:8.

In some embodiments, the at least one acceptor material is present in the mixed photoactive layer 130 in an amount less than the at least one donor material. In certain embodiments, the mixed photoactive layer 130 comprises the at least one acceptor material and the at least one donor material at a donor:acceptor ratio ranging from 1:1 to 50:1, such as, for example, from 1:1 to 35:1, from 1:1 to 25:1, from 1:1 to 20:1, from 2:1 to 16:1, from 2:1 to 12:1, from 4:1 to 10:1, or from 4:1 to 8:1.

In some embodiments, the at least one donor material is present in a greater amount than the at least one acceptor material at the second boundary interface 170. In some embodiments, the at least one donor material is present in a lesser amount than the at least one acceptor material at the second boundary interface. In certain embodiments, a ratio of the at least one donor material to the at least one acceptor material at the second boundary interface ranges from 1:1 to 10:1, such as, for example, from 1:1 to 8:1, from 1:1 to 4:1, from 1:1 to 3:1, from 1:1 to 2:1, from 1:1 to 1.8:1, from 1:1 to 1.6:1, from 1:1 to 1.4:1, from 1:1 to 1.2:1, from 1:1 to 1.1:1, from 1.1:1 to 3:1, from 1.2:1 to 2:1, from 1.3:1 to 1.9:1, or from 1.4:1 to 1.8:1. In certain embodiments, a ratio of the at least one donor material to the at least one acceptor material at the second boundary interface ranges from 1:1 to 1:10, such as, for example, from 1:1 to 1:8, from 1:1 to 1:6, from 1:1 to 1:4, from 1:1 to 1:3, from 1:1 to 1:2, from 1:1 to 1:1.8, from 1:1 to 1:1.6, from 1:1 to 1:1.4, from 1:1 to 1:1.2, from 1:1 to 1:1.1, from 1:1.1 to 1:3, from 1:1.2 to 1:2, from 1:1.3 to 1:1.9, or from 1:1.4 to 1:1.8.

In some embodiments, the at least one acceptor material is present in a greater amount than the at least one donor material at the first boundary interface 160. In some embodiments, the at least one acceptor material is present in a lesser amount than the at least one donor material at the first boundary interface. In certain embodiments, a ratio of the at least one donor material to the at least one acceptor material at the first boundary interface ranges from 1:1 to 1:20, such as, for example, from 1:1 to 1:15, from 1:1 to 1:12, from 1:1 to 1:10, from 1:1 to 1:8, from 1:1 to 1:6, from 1:1 to 1:4, from 1:1 to 1:2, from 1:2 to 1:20, from 1:3 to 1:15, from 1:4 to 1:12, from 1:5 to 1:10, from 1:6 to 1:9, or from 1:7 to 1:8. In certain embodiments, a ratio of the at least one donor material to the at least one acceptor material at the first boundary interface ranges from 1:1 to 10:1, such as, for example, from 1:1 to 8:1, from 1:1 to 6:1, from 1:1 to 4:1, from 1:1 to 3:1, from 1:1 to 2:1, or from 1:1 to 1.5:1.

As shown in FIG. 1, a first photoactive layer 140 is adjacent to the mixed photoactive layer 130 and interfaces with the first boundary interface 160. The first photoactive layer may be an acceptor relative to the at least one donor material of the mixed photoactive layer, and may facilitate the transport of electrons to electrode 150. Excitons generated in the first photoactive layer can diffuse to the mixed photoactive layer (i.e., the graded heterojunction layer) where they may dissociate into electrons and holes. The first photoactive layer comprises a material having a LUMO energy within 0.3 eV, within 0.2 eV, within 0.1 eV, or within 0.05 eV of the LUMO energy of the at least one acceptor material of the mixed photoactive layer. In some embodiments, at least 50%, at least 60%, at least 70%, at least 80%, at least 90%, at least 95%, at least 96%, at least 97%, at least 98%, at least 99%, or at least 99.9% of material comprising the first photoactive layer is the material having a LUMO energy within 0.3 eV, within 0.2 eV, within 0.1 eV, or within 0.05 eV of the LUMO energy of the at least one acceptor material. In certain embodiments, the material having a LUMO energy within 0.3 eV, within 0.2 eV, within 0.1 eV, or within 0.05 eV of the LUMO energy of the at least one acceptor material is the same material as the at least one acceptor material.

In some embodiments, the first photoactive layer 140 has a thickness within 2 times, within 1.5 times, or within 1 time of an exciton diffusion length of the material having a LUMO energy within 0.3 eV of the LUMO energy of the at least one acceptor material. In some embodiments, the first photoactive layer has a thickness within 5 nm, within 4 nm, within 3 nm, within 2 nm, within 1 nm, or within 0.5 nm of an exciton diffusion length of the material having a LUMO energy within 0.3 eV of the LUMO energy of the at least one acceptor material. In certain embodiments, the first photoactive layer has a thickness less than 60 nm, less than 50 nm, less than 40 nm, less than 30 nm, less than 25 nm, less than 20 nm, less than 15 nm, less than 10 nm, less than 8 nm, less than 5 nm, less than 3 nm, or less than 1 nm.

Figure 2:
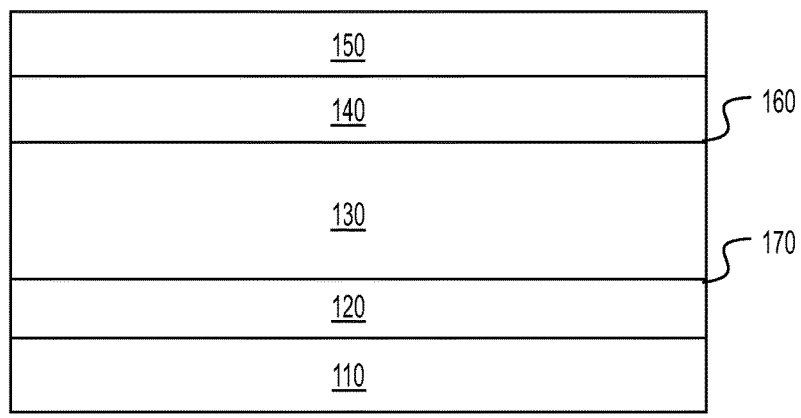
FIG. 2 shows a schematic of another exemplary device comprising a hybrid planar-graded heterojunction according to the present disclosure.

As shown in the non-limiting device schematic in FIG. 2, device 100 from FIG. 1 may further comprise a second photoactive layer 120 adjacent to the mixed photoactive layer 130 and interfacing with the second boundary interface 170. The second photoactive layer may be a donor relative to the at least one acceptor material of the mixed photoactive layer, and may facilitate the transport of holes to electrode 110. Excitons generated in the second photoactive layer can diffuse to the mixed photoactive layer (i.e., the graded heterojunction layer) where they may dissociate into electrons and holes. The second photoactive layer comprises a material having a HOMO energy within 0.3 eV, within 0.2 eV, within 0.1 eV, or within 0.05 eV of the HOMO energy of the at least one donor material. In some embodiments, at least 50%, at least 60%, at least 70%, at least 80%, at least 90%, at least 95%, at least 96%, at least 97%, at least 98%, at least 99%, or at least 99.9% of material comprising the second photoactive layer is the material having a HOMO energy within 0.3 eV, within 0.2 eV, within 0.1 eV, or within 0.05 eV of the HOMO energy of the at least one donor material. In certain embodiments, the material having a HOMO energy within 0.3 eV, within 0.2 eV, within 0.1 eV, or within 0.05 eV of the HOMO energy of the at least one donor material is the same material as the at least one donor material.

In some embodiments, the second photoactive layer 120 has a thickness within 2 times, within 1.5 times, or within 1 time of an exciton diffusion length of the material having a HOMO energy within 0.3 eV of the HOMO energy of the at least one donor material. In some embodiments, the second photoactive layer has a thickness within 5 nm, within 4 nm, within 3 nm, within 2 nm, within 1 nm, or within 0.5 nm of an exciton diffusion length of the material having a HOMO energy within 0.3 eV of the HOMO energy of the at least one donor material. In certain embodiments, the second photoactive layer has a thickness less than 60 nm, less than 50 nm, less than 40 nm, less than 30 nm, less than 25 nm, less than 20 nm, less than 15 nm, less than 10 nm, less than 8 nm, less than 5 nm, less than 3 nm, or less than 1 nm.

In some embodiments, the first photoactive layer 140 has a thickness within 2 times, within 1.5 times, or within 1 time of an exciton diffusion length of the material having a LUMO energy within 0.3 eV of the LUMO energy of the at least one acceptor material, and the second photoactive layer 120 has a thickness within 2 times, within 1.5 times, or within 1 time of an exciton diffusion length of the material having a HOMO energy within 0.3 eV of the HOMO energy of the at least one donor material.

Figure 3:
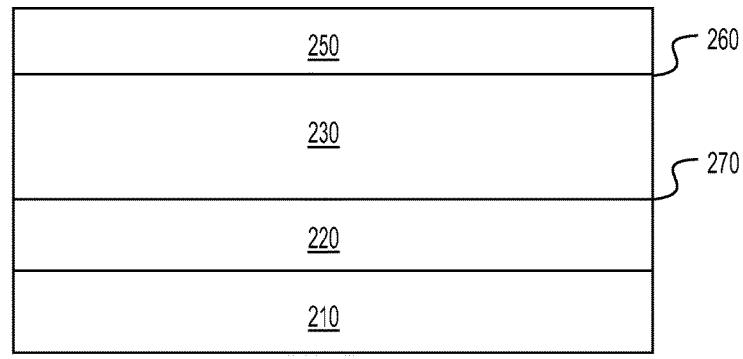
FIG. 3 shows a schematic of an additional exemplary device comprising a hybrid planar-graded heterojunction according to the present disclosure.

As shown in FIG. 3, also disclosed herein is an organic photosensitive optoelectronic device 200 comprising two electrodes 210 and 250 in superposed relation, a mixed photoactive layer 230 located between the two electrodes, wherein the mixed photoactive layer has a first boundary interface 260 and a second boundary interface 270 and comprises at least one donor material having a HOMO energy and at least one acceptor material having a LUMO, wherein a concentration of the at least one acceptor material in the mixed layer is maximum at the first boundary interface 260 and decreases in the direction of the second boundary interface 270, and wherein a concentration of the at least one donor material in the mixed layer is maximum at the second boundary interface 270 and decreases in the direction of the first boundary interface 260; and a photoactive layer 220 adjacent to the mixed photoactive layer and interfacing with the second boundary interface 270, wherein the photoactive layer comprises a material having a HOMO energy within 0.3 eV of the HOMO energy of the at least one donor material.

As shown in FIG. 3, in some embodiments, the mixed photoactive layer 230 is adjacent to and interfaces with electrode 250. In other embodiments, the device may further comprise at least one buffer layer between electrode 250 and the mixed photoactive layer 230. The at least one buffer layer may be positioned adjacent to and may interface with the mixed photoactive layer. The buffer layer may be selected so as not to inhibit the transport of electrons to electrode 250. In some embodiments, the buffer layer is an electron-transport material. In some embodiments, the buffer layer is an exciton-blocking electron-transport material. The buffer layer may comprise materials known in the art, such as organic materials. Examples of buffer materials include but are not limited to bathocuproine (BCP), bathophenanthroline (BPhen), 1,4,5,8-Naphthalene-tetracarboxylic-dianhydride (NTCDA), 3,4,9,10-perylenetetracarboxylicbis-benzimidazole (PTCBI), 1,3,5-tris(N-phenylbenzimidazol-2-yl)benzene (TPBi), tris (acetylacetonato) ruthenium(III) (Ru(acac)3), and aluminum (III)phenolate (Alq2 OPH), N,N'-diphenyl-N,N'-bis-alpha-naphthylbenzidine (NPD), aluminum tris(8-hydroxyquinoline) (Alq3), and carbazole biphenyl (CBP). In some embodiments, the buffer layer is a self-assembled monolayer.

As before, one of the electrodes may be an anode, and the other electrode a cathode. For example, in FIG. 3, electrode 210 may be an anode, and electrode 250 may be a cathode.

The mixed photoactive layer 230 is a graded heterojunction layer. It comprises at least one donor material having a HOMO energy and at least one acceptor material having a LUMO energy as described herein.

As shown in FIG. 3, a photoactive layer 220 is adjacent to the mixed photoactive layer 230 and interfaces with the second boundary interface 270. The photoactive layer may be a donor relative to the at least one acceptor material of the mixed photoactive layer, and may facilitate the transport of holes to electrode 210. Excitons generated in the photoactive layer can diffuse to the mixed photoactive layer (i.e., the graded heterojunction layer) where they may dissociate into electrons and holes. The photoactive layer comprises a material having a HOMO energy within 0.3 eV, within 0.2 eV, within 0.1 eV, or within 0.05 eV of the HOMO energy of the at least one donor material of the mixed photoactive layer. In some embodiments, at least 50%, at least 60%, at least 70%, at least 80%, at least 90%, at least 95%, at least 96%, at least 97%, at least 98%, at least 99%, or at least 99.9% of material comprising the photoactive layer is the material having a HOMO energy within 0.3 eV, within 0.2 eV, within 0.1 eV, or within 0.05 eV of the HOMO energy of the at least one donor material. In certain embodiments, the material having a HOMO energy within 0.3 eV, within 0.2 eV, within 0.1 eV, or within 0.05 eV of the HOMO energy of the at least one donor material is the same material as the at least one donor material.

In some embodiments, the photoactive layer 220 has a thickness within 2 times, within 1.5 times, or within 1 time of an exciton diffusion length of the material having a HOMO energy within 0.3 eV of the HOMO energy of the at least one donor material. In some embodiments, the photoactive layer has a thickness within 5 nm, within 4 nm, within 3 nm, within 2 nm, within 1 nm, or within 0.5 nm of an exciton diffusion length of the material having a HOMO energy within 0.3 eV of the HOMO energy of the at least one donor material. In certain embodiments, the photoactive layer has a thickness less than 60 nm, less than 50 nm, less than 40 nm, less than 30 nm, less than 25 nm, less than 20 nm, less than 15 nm, less than 10 nm, less than 8 nm, less than 5 nm, less than 3 nm, or less than 1 nm.

Organic photosensitive optoelectronic devices of the present disclosure may further comprise additional layers as known in the art for such devices. For example, devices may further comprise charge carrier transport layers and/or buffers layers such as one or more blocking layers, such as exciton blocking layers (EBL). These additional layers may be located between an electrode and the photoactive layers. Examples of blocking layers are described in U.S. Patent Publication Nos. 2012/0235125 and 2011/0012091 and in U.S. Pat. Nos. 7,230,269 and 6,451,415, which are incorporated herein by reference for their disclosure of blocking layers.

In addition, the devices may further comprise at least one smoothing layer. A smoothing layer may be located, for example, between the photoactive layers and either or both of the electrodes. A film comprising 3,4 polyethylenedioxythiophene:polystyrenesulfonate (PEDOT:PSS) is an example of a smoothing layer.

The organic photosensitive optoelectronic devices of the present disclosure may exist as a tandem device comprising two or more subcells. A subcell, as used herein, means a component of the device which comprises at least one donor-acceptor heterojunction. When a subcell is used individually as a photosensitive optoelectronic device, it typically includes a complete set of electrodes. A tandem device may comprise charge transfer material, electrodes, or charge recombination material or a tunnel junction between the tandem donor-acceptor heterojunctions. In some tandem configurations, it is possible for adjacent subcells to utilize common, i.e., shared, electrode, charge transfer region or charge recombination zone. In other cases, adjacent subcells do not share common electrodes or charge transfer regions. The subcells may be electrically connected in parallel or in series.

In some embodiments, the charge transfer layer or charge recombination layer may be chosen from Al, Ag, Au, $MoO_3$, Li, LiF, Sn, Ti, WO3, indium tin oxide (ITO), tin oxide (TO), gallium indium tin oxide (GITO), zinc oxide (ZO), or zinc indium tin oxide (ZITO). In another embodiment, the charge transfer layer or charge recombination layer may be comprised of metal nanoclusters, nanoparticles, or nanorods.

The devices of the present disclosure may be, for example, photodetectors, photoconductors, or photovoltaic devices, such as solar cells.

Layers and materials may be deposited using techniques known in the art. For example, the layers and materials described herein can be deposited or co-deposited from a solution, vapor, or a combination of both. In some embodiments, organic materials or organic layers can be deposited or co-deposited via solution processing, such as by one or more techniques chosen from spin-coating, spin-casting, spray coating, dip coating, doctor-blading, inkjet printing, or transfer printing.

In other embodiments, organic materials may be deposited or co-deposited using vacuum evaporation, such as vacuum thermal evaporation, organic vapor phase deposition, or organic vapor-jet printing.

The graded heterojunction layer of the present disclosure may be fabricated by varying deposition conditions. For example, concentration gradients of donor and acceptor materials in the mixed layer can be controlled by varying the deposition rate of each material.

It should be understood that embodiments described herein may be used in connection with a wide variety of structures. Functional organic photovoltaic devices may be achieved by combining the various layers described in different ways, or layers may be omitted entirely, based on design, performance, and cost factors. Additional layers not specifically described may also be included. Materials other than those specifically described may be used. The names given to the various layers herein are not intended to be strictly limiting.

Other than in the examples, or where otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

The devices and methods described herein will be further described by the following non-limiting examples, which are intended to be purely exemplary.

EXAMPLES

Figure 5:
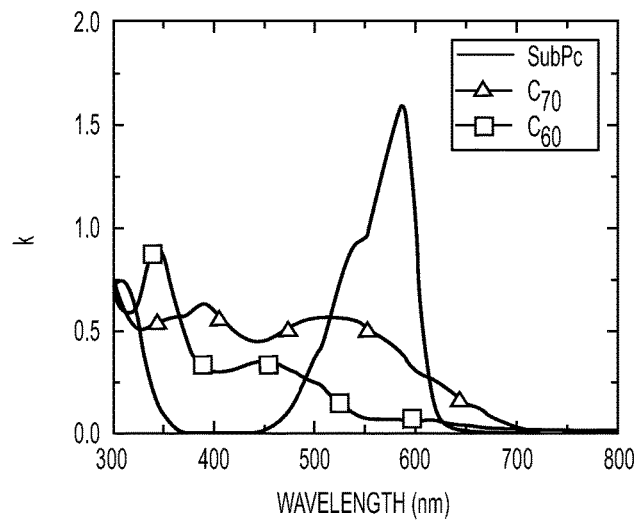
FIG. 5 shows extinction coefficients of SubPc, $C_{60}$ and $C_{70}$.
Figures 6A, 6B, 6C, 6D:
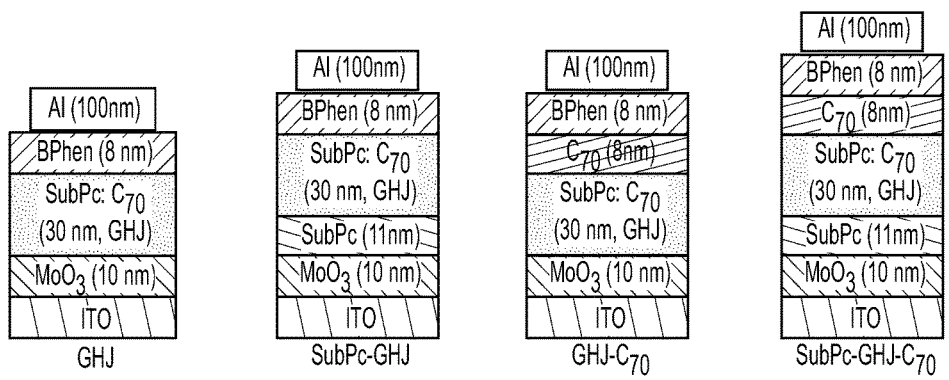

Four organic photovoltaic devices were fabricated using boron subphthalocyanine chloride (SubPc) as donor and $C_{70}$ as acceptor. SubPc has a deep highest occupied molecular orbital (HOMO) energy of −5.6 eV and a large extinction coefficient as shown in FIG. 5. $C_{70}$ has a broadened absorption spectrum compared to $C_{60}$ (see FIG. 5). The four organic photovoltaic device structures are shown in FIGS. 6A, 6B, 6C, and 6D, respectively. Graded HJ and planar-graded HJ cells were fabricated via vacuum thermal evaporation (VTE). The control device shown in FIG. 6A contained a graded HJ layer as the only photoactive layer. The device in FIG. 6B had an 11 nm thick neat SubPc layer underneath the graded HJ layer (SubPc-GHJ). The device in FIG. 6C had an 8 nm thick neat $C_{70}$ layer on top of the graded HJ layer (GHJ-$C_{70}$). The device in FIG. 6D had both neat SubPc and $C_{70}$ layers sandwiching the graded HJ layer (SubPc-GHJ-$C_{70}$). The graded HJ layer was 30 nm thick and was fabricated by continuously changing the deposition rate of SubPc and $C_{70}$ from 0.012 nm/s to 0.010 nm/s and from 0.020 nm/s to 0.080 nm/s, respectively. These deposition conditions led to a donor:acceptor ratio at the interface of the graded heterojunction layer and either the SubPc or $MoO_3$ layer of about 1:1.6, and a donor:acceptor ratio at the interface of the graded heterojunction layer and either the $C_{70}$ or BPhen layer of 1:8.

The current-voltage (J-V) characteristics and external quantum efficiency (EQE) spectrum of the graded HJ and planar-graded HJ cells under AM1.5G, 1 sun intensity simulated solar illumination are shown in FIG. 7 and FIG. 8, respectively, with device performance characteristics summarized in Table I. For comparison, a graded HJ cell with $C_{60}$ as the acceptor was also fabricated and results included. The $C_{70}$-based graded HJ cell had similar $V_{OC}$ and FF compared to that with $C_{60}$. $J_{SC}$ of the $C_{70}$-based graded HJ, however, had a 25% increase due to enhanced absorption of $C_{70}$ as shown in FIG. 5. As shown in the EQE spectrum of FIG. 8, the $C_{70}$-based graded HJ had higher EQE than the $C_{60}$-based cell across the visible range. Planar-graded HJ cells with neat SubPc layers underneath, i.e., SubPc-GHJ (device (b)) and SubPc-GHJ-C70 (device (d)), both showed poor FF (<0.40), which was attributed to the SubPc layer's lower hole mobility than the mixed layer, limiting the charge carrier transport in the devices. The planar-graded HJ cell with a neat $C_{70}$ layer (device (c)) had similar $V_{OC}$ and FF to the control cell (device (a)) but exhibited a 20% increase in $J_{SC}$. The power conversion efficiency (PCE) of the planar-graded HJ with a neat $C_{70}$ layer (device (c)) reached 4.6±0.2% under 1 sun illumination compared to 3.8±0.2% for the graded HJ control cell.

EQE is defined as a product of absorption efficiency and internal quantum efficiency (IQE). The transfer matrix method was used to calculate the absorption efficiency, ηA, to further understand the origin of improvement in EQE in the planar-graded HJ cells. IQE was calculated by using EQE divided by ηA. As shown in FIG. 9, absorption efficiency and IQE of the planar-graded HJ was higher than the graded HJ across the visible region. The IQE increase was attributed to the improved charge carrier extraction in the planar-graded HJ. From the spatial distribution of absorbed optical power inside the device at the wavelength of 500 nm, as shown in FIG. 10, the additional $C_{70}$ can absorb more photons, which enhanced the absorption in the planar graded HJ cell.

To further optimize device performance, the thickness of the neat $C_{70}$ layer was varied. Device performance is summarized in Table II. The J-V characteristics and EQE spectrum are shown in FIG. 11 and FIG. 12, respectively. All of the cells had similar $V_{OC}$ and FF. $J_{SC}$ increased as the thickness of the $C_{70}$ layer increased and reached its maximum at 8 nm. $J_{SC}$ then started to decrease for a thicker $C_{70}$ layer. The EQE spectrum showed the same trend. The optimal thickness of the neat $C_{70}$ layer was 8 nm, which is comparable to the exciton diffusion length of $C_{70}$ (8.0±0.8 nm). This result indicated that excitons generated in the 8 nm thick $C_{70}$ layer efficiently diffused to the interface of the graded HJ layer and the neat $C_{70}$ layer for dissociation.

TABLE I

| Cell Structure | $V_{OC}$ (V) | $J_{SC}$ (mA/cm$^2$) | FF | PCE (%) 1 sun, AM1.5G |
|---|---|---|---|---|
| GHJ (C60) | 1.06 | 6.1 | 0.48 | 3.0 (±0.1) |
| GHJ (C70) | 1.02 | 7.4 | 0.50 | 3.8 (±0.1) |
| SubPc-GHJ | 1.08 | 6.6 | 0.36 | 2.6 (±0.1) |
| SubPc-GHJ-C70 | 1.07 | 8.2 | 0.37 | 3.2 (±0.1) |
| GHJ-C70 | 1.04 | 9.0 | 0.49 | 4.6 (±0.2) |

TABLE II

| Thickness of neat $C_{70}$ layer (x nm) | $V_{OC}$ (V) | $J_{SC}$ (mA/cm$^2$) | FF | PCE (%) 1 sun, AM1.5G |
|---|---|---|---|---|
| 0 | 1.02 | 7.4 | 0.50 | 3.8 (±0.1) |
| 3 | 1.03 | 8.0 | 0.48 | 4.0 (±0.1) |
| 8 | 1.04 | 9.0 | 0.49 | 4.6 (±0.2) |
| 13 | 1.05 | 8.6 | 0.50 | 4.4 (±0.1) |

What is claimed is:

1. An organic photosensitive optoelectronic device comprising:
    two electrodes in superposed relation;
    a mixed photoactive layer located between the two electrodes, wherein the mixed photoactive layer is a single layer having first and second boundary interfaces and comprises at least one donor material having a highest occupied molecular orbital (HOMO) energy and at least one acceptor material having a lowest unoccupied molecular orbital energy (LUMO), wherein a concentration of the at least one acceptor material in the mixed layer is at a maximum at the first boundary interface and decreases in the direction of the second boundary interface to form a concentration gradient of the at least one acceptor material within the mixed layer, and wherein a concentration of the at least one donor material in the mixed layer is at a maximum at the second boundary interface and decreases in the direction of the first boundary interface to form a concentration gradient of the at least one donor material within the mixed layer; and
    a first photoactive layer adjacent to the mixed photoactive layer and interfacing with the first boundary interface, wherein the first photoactive layer comprises a material having a LUMO energy within 0.3 eV of the LUMO energy of the at least one acceptor material;
    wherein the at least one donor material is present in a lesser amount than the at least one acceptor material at the second boundary interface.

2. The device of claim 1, wherein the first photoactive layer comprises a material having a LUMO energy within 0.1 eV of the LUMO energy of the at least one acceptor material.

3. The device of claim 2, wherein the material having a LUMO energy within 0.1 eV of the LUMO energy of the at least one acceptor material is the same material as the at least one acceptor material.

4. The device of claim 1, wherein the mixed photoactive layer comprises the at least one donor material and the at least one acceptor material at a donor:acceptor ratio ranging from 1:2 to 1:50.

5. The device of claim 4, wherein the donor:acceptor ratio ranges from 1:4 to 1:12.

6. The device of claim 1, wherein the lesser amount of the at least one donor material at the second boundary interface corresponds to a donor:acceptor ratio less than 1:1 but not less than 1:4.

7. The device of claim 1, wherein a ratio of the at least one donor material to the at least one acceptor material at the first boundary interface ranges from 1:2 to 1:20.

8. The device of claim 1, wherein the first photoactive layer has a thickness within 2 times of an exciton diffusion length of the material having a LUMO energy within 0.3 eV of the LUMO energy of the at least one acceptor material.

9. The device of claim 1, wherein the first photoactive layer has a thickness less than 30 nm.

10. The device of claim 9, wherein the thickness is less than 10 nm.

11. The device of claim 1, wherein the at least one acceptor material comprises a fullerene or derivative thereof.

12. The device of claim 1, further comprising a second photoactive layer adjacent to the mixed photoactive layer and interfacing with the second boundary interface, wherein the second photoactive layer comprises a material having a HOMO energy within 0.3 eV of the HOMO energy of the at least one donor material.

13. The device of claim 12, wherein the second photoactive layer comprises a material having a HOMO energy within 0.1 eV of the HOMO energy of the at least one donor material.

14. The device of claim 13, wherein the material having a HOMO energy within 0.1 eV of the HOMO energy of the at least one donor material is the same material as the at least one donor material.

15. The device of claim 12, wherein the second photoactive layer has a thickness within 2 times of an exciton diffusion length of the material having a HOMO energy within 0.3 eV of the HOMO energy of the at least one donor material.

16. The device of claim 12, wherein the second photoactive layer has a thickness less than 20 nm.

17. The device of claim 12, wherein the first photoactive layer has a thickness within 2 times of an exciton diffusion length of the material having a LUMO energy within 0.3 eV of the LUMO energy of the at least one acceptor material, and the second photoactive layer has a thickness within 2 times of an exciton diffusion length of the material having a HOMO energy within 0.3 eV of the HOMO energy of the at least one donor material.

18. An organic photosensitive optoelectronic device comprising:
    two electrodes in superposed relation;

a mixed photoactive layer located between the two electrodes, wherein the mixed photoactive layer is a single layer having first and second boundary interfaces and comprises at least one donor material having a highest occupied molecular orbital (HOMO) energy and at least one acceptor material having a lowest unoccupied molecular orbital energy (LUMO), wherein a concentration of the at least one acceptor material in the mixed layer is maximum at the first boundary interface and decreases in the direction of the second boundary interface to form a concentration gradient of the at least one acceptor material within the mixed layer, and wherein a concentration of the at least one donor material in the mixed layer is maximum at the second boundary interface and decreases in the direction of the first boundary interface to form a concentration gradient of the at least one donor material within the mixed layer; and a photoactive layer adjacent to the mixed photoactive layer and interfacing with the second boundary interface, wherein the photoactive layer comprises a material having a HOMO energy within 0.3 eV of the HOMO energy of the at least one donor material;

wherein the at least one donor material is present in a lesser amount than the at least one acceptor material at the second boundary interface.

19. The device of claim 18, wherein the photoactive layer comprises a material having a HOMO energy within 0.1 eV of the HOMO energy of the at least one donor material.

20. The device of claim 19, wherein the material having a HOMO energy within 0.1 eV of the HOMO energy of the at least one donor material is the same material as the at least one donor material.

21. The device of claim 18, wherein the photoactive layer has a thickness within 2 times of an exciton diffusion length of the material having a HOMO energy within 0.3 eV of the HOMO energy of the at least one donor material.

22. The device of claim 18, wherein the photoactive layer has a thickness less than 20 nm.

* * * * *